(12) United States Patent
Smith et al.

(10) Patent No.: US 7,659,126 B1
(45) Date of Patent: Feb. 9, 2010

(54) ELECTRICAL TEST METHOD AND APPARATUS

(75) Inventors: Ian Robert Smith, Los Gatos, CA (US); Christopher F. Bevis, Los Gatos, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 418 days.

(21) Appl. No.: 11/625,546

(22) Filed: Jan. 22, 2007

(51) Int. Cl.
*H01L 21/00* (2006.01)

(52) U.S. Cl. ............................. 438/14; 438/17; 324/765

(58) Field of Classification Search .................. 438/14, 438/17; 324/765
See application file for complete search history.

(56) References Cited

U.S. PATENT DOCUMENTS

| | | | | |
|---|---|---|---|---|
| 4,706,015 | A | 11/1987 | Chen | 324/64 |
| 6,191,658 | B1 | 2/2001 | Fairbanks | 331/57 |
| 6,327,394 | B1* | 12/2001 | Kash et al. | 382/280 |
| 6,400,230 | B2* | 6/2002 | Fairbanks | 331/57 |
| 6,657,502 | B2* | 12/2003 | Bushman et al. | 331/57 |
| 6,700,399 | B1* | 3/2004 | Savithri | 324/765 |
| 6,791,697 | B1* | 9/2004 | Nariman | 356/603 |
| 6,801,096 | B1* | 10/2004 | Nariman et al. | 331/57 |
| 7,109,734 | B2* | 9/2006 | Yuan et al. | 324/763 |
| 7,109,738 | B2* | 9/2006 | Savithri | 324/765 |
| 7,126,405 | B2* | 10/2006 | Fairbanks | 327/293 |
| 7,129,696 | B2* | 10/2006 | Savithri | 324/158.1 |
| 7,382,149 | B2* | 6/2008 | Anand et al. | 324/769 |
| 7,489,152 | B2* | 2/2009 | Yuan et al. | 324/763 |
| 7,493,531 | B2* | 2/2009 | Ito et al. | 714/708 |
| 2001/0011929 | A1* | 8/2001 | Fairbanks | 331/57 |
| 2005/0149777 | A1* | 7/2005 | Yuan et al. | 714/700 |

(Continued)

OTHER PUBLICATIONS

Agilent Technologies, "Accurate and Efficient Frequency Evaluation of a Ring Oscillator", Application Note 4070-3, Nov. 2000.

(Continued)

*Primary Examiner*—Laura M Menz
(74) *Attorney, Agent, or Firm*—Joshua D. Isenberg; JDI Patent

(57) ABSTRACT

An electrical test method and apparatus are disclosed. In the method one or more ring oscillators are formed in one or more layers prior to formation of a metal 1 layer of a semiconductor wafer. The one or more layers comprise the formulation of transistors and local interconnects. One or more test structures are formed in one or more interconnect layers at or after the metal 1 of the semiconductor wafer. Each test structure is coupled to a corresponding one or more ring oscillators. A voltage is applied to one or more non-precision contacts to cause the ring oscillators to oscillate. At-speed performance of one or more test structures is determined from one or more measured signals obtained from the test structures. The electrical test apparatus includes one or more ring oscillators formed in one or more layers prior to formation of a metal 1 comprising the formulation of transistors and local interconnects of a semiconductor wafer and one or more test structures formed in one or more interconnect layers at or after the metal 1 of the semiconductor wafer. Each test structure is coupled to one or more corresponding ring oscillators. A non-precision contact is coupled to the one or more ring oscillators for applying voltage to one or more non-precision contacts to cause the ring oscillators to oscillate.

21 Claims, 6 Drawing Sheets

U.S. PATENT DOCUMENTS

2005/0281112 A1* 12/2005 Ito et al. ............... 365/222
2006/0049886 A1* 3/2006 Agostinelli et al. ......... 331/175
2006/0109020 A1* 5/2006 Savithri ............... 324/765
2006/0109021 A1* 5/2006 Savithri ............... 324/765

OTHER PUBLICATIONS

Joseph Sinohin Panganiban, "A Ring Oscillator Based Variation Test Chip", Massachusetts Institute of Technology's—Department of Electrical Engineering and Computer Science, Jun. 2002.

* cited by examiner

ELECTRICAL TEST METHOD AND APPARATUS

FIELD OF THE INVENTION

This invention generally relates to semiconductor device fabrication and more particularly to performance testing of metal and transistor layers in semiconductor device fabrication.

BACKGROUND OF THE INVENTION

In semiconductor device fabrication oscillators are known in numerous applications, such as clock references, frequency synthesis and many others, to provide timing signal for handling information. Transistor-based oscillators have been built into semiconductor wafers or chips as test structures. The behavior of the oscillators depends on the characteristics of the transistors and interconnects from which they are made. Since the oscillators are made using the same transistor, metal, and insulator layers as other devices in the chip, such test structures can provide information about the performance of the chip at-speed.

One type of oscillator is based on inverters connected together in a ring. An inverter produces an output voltage opposite to its input. For example, an inverter may invert a low voltage (e.g. logical zero) to high voltage (e.g. logical 1), providing a full swing so that amplification is not necessary. As illustrated on FIG. 1A, a single inverter may consist of two transistors 110 and 120. The gates 114 and 124 of those transistors are tied together at an input 102, and drains 116 and 126 are tied together at an output 104. The source 112 is connected to a source voltage 118 and source 122 is connected to the ground 128. When input 102 is a logical "1", transistor 110 becomes conductive and transistor 120 becomes non-conductive. Thus a logical "0" is transmitted to output 104. If a logical "0" is applied to input 102 transistor 120 becomes transparent and transistor 110 becomes opaque thus a logical "1" is transmitted to output 104.

A ring oscillator may be constructed from odd number of inverters connected in a ring. A typical three-inverter or three-gate ring oscillator 101 is shown on FIG. 1B. Inverters 130, 140, 150 are connected in a ring so that outputs 134, 144 and 154 of each inverter are coupled with the inputs 142, 152 and 132 of the next inverter in a ring. Three-inverter oscillators can be made to oscillate at frequencies of about 2.3 GHz. A three-gate ring oscillator has three phases because each of the three outputs transition between states at different times due to the delay between the changes of a given input-output. If finer separation is required, more stages may be added, e.g., as in a five or seven gate ring oscillator. Adding more stages also makes the ring oscillator circuit oscillate at a lower frequency.

Product sort ring oscillator (PSRO) structures and other active at-speed device test structures including delay lines, memory cells and the like are used to assess transistor and interconnect performance as a routine part of wafer test, typically at the Metal 1 stage of manufacturing. Test structures are built in the scribe line and may also be embedded within the active area of the device to reveal cross chip transistor performance variation. The PSRO oscillation frequency is indicative of device switching speed (also known as gate delay or propagation delay). Furthermore, the oscillator bandwidth may provide an indication of characteristics such as capacitance, resistance, etc. of the devices and interconnect structures. Therefore, PSRO oscillation frequency and bandwidth are highly indicative of end of line device performance.

The use of PRSO's enables early and more definitive yield prediction, process feedback and feed-forward, including refined yield/performance tradeoffs to be made in subsequent process steps to optimize gross margin per wafer. This information complements less convoluted parametric information such as linewidth and film thickness.

Typically the test structures are powered by external power sources via mechanical contact probes to test pads on the wafer. Metal traces on the wafer connect from the test pad to the PSRO. Signals from the test structure are also accessed by precision contact probes. Typically mechanical probes access several different regions of a wafer at a time, making contact to individual test structures and measuring them in parallel. This process requires accurate navigation of the probes to space-consuming contact pads, jeopardizes yield due to probe contact and defect generation close to the product devices, and requires complex and expensive test equipment as well as precision probes. Furthermore, it is generally a slow process since multiple sites on the wafer must be measured serially.

Recently it has been proposed to power-up devices and to enable probing of test structures in a non-contact manner. In one proposed prior art powering scheme, PSRO's are powered by illuminating embedded photocells on the wafer, which are connected to the PSRO. Power for the PSRO and DC or AC test signals are generated by on-chip photodiodes energized by an external light sources or thermal sources. Signals from the test structure can be measured using a variety of non-contact techniques, including RF emission, Kelvin probe, optical probing etc. The advantage of this is that the test structures can be probed without damage at multiple stages during the fabrication process. Unfortunately, the embedded photocells increase the footprint of the test structures. Furthermore, the need to tightly define the spatial extent of the illuminating beam means that the measurement method requires high spatial precision and sophisticated optics, and thus does not serve the goal of measuring multiple sites simultaneously across an entire wafer.

What would be desirable is a method by which all test structures on an entire wafer could be simultaneously powered up and analyzed at various stages during device processing, without need for local contact to the devices, large test pattern footprint, navigational precision, expensive test equipment, precision optics or precision alignment of probes.

It is within this context that embodiments of the present invention arise.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Embodiments of the present invention use the behavior of the ring oscillators to provide information on performance of the metal and transistor layers. Embodiments of the present invention recognize the fact that immediately following deposition or plating of the first and subsequent interconnect films (typically Metal 1 and beyond) and before polishing or patterning and etching of that film (depending on the interconnect process design), the power and ground connections for all devices on the wafer, including the PSRO structures, are simultaneously interconnected in parallel and readily accessible. A single non-precision electrical contact to any point on this film comes halfway to realizing the goal of powering up all test structures simultaneously. Obviously the problem here is that under normal circumstances the power and ground connections to the devices are both connected to and therefore short circuited by the Metal 1 film, and therefore it is not possible to activate any devices. What is desired is a method of isolating one power terminal of the devices which are to be operative (the PSRO) from the interconnect film, and providing a second non-precision connection and conduction path to those terminals. As a result, all the selected devices on the wafer can be simultaneously activated with an external power supply applied to two simple connections to the wafer.

Figure 1A:
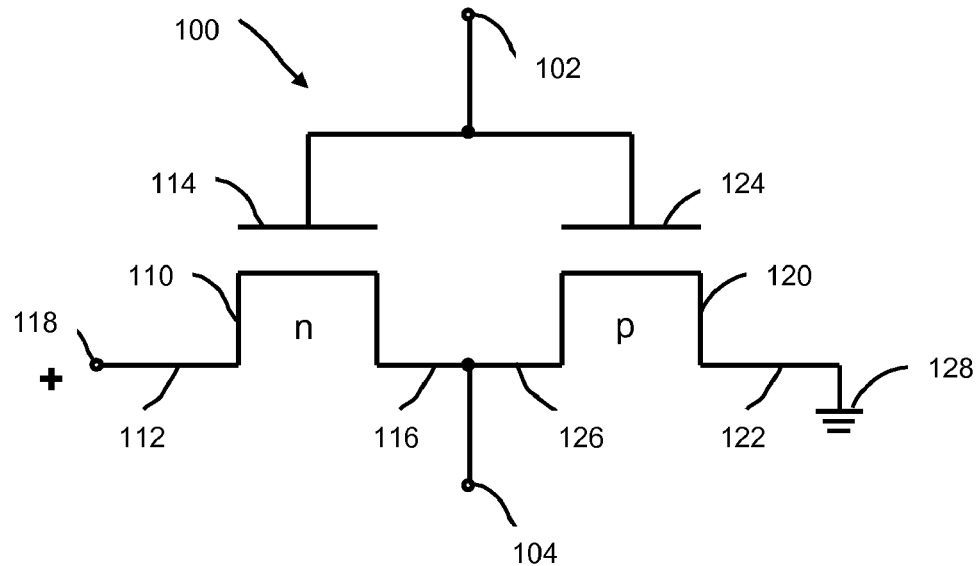
FIG. 1A is a schematic diagram of an inverter according to the prior art.
Figure 1B:
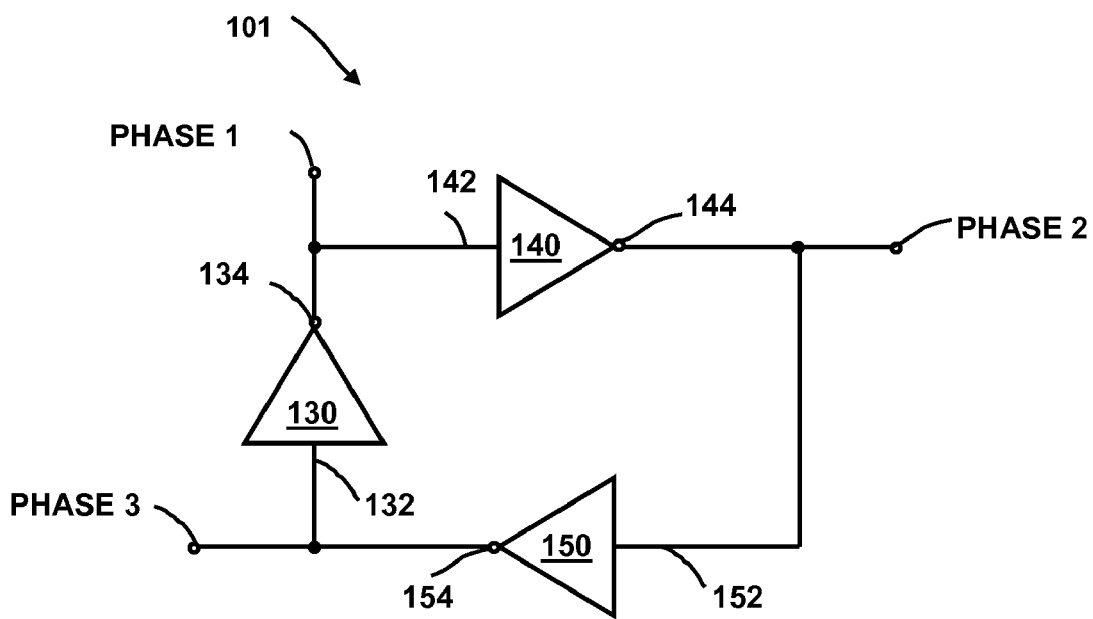
FIG. 1B is a schematic diagram of a ring-type oscillator circuit according to the prior art.
Figure 2A:
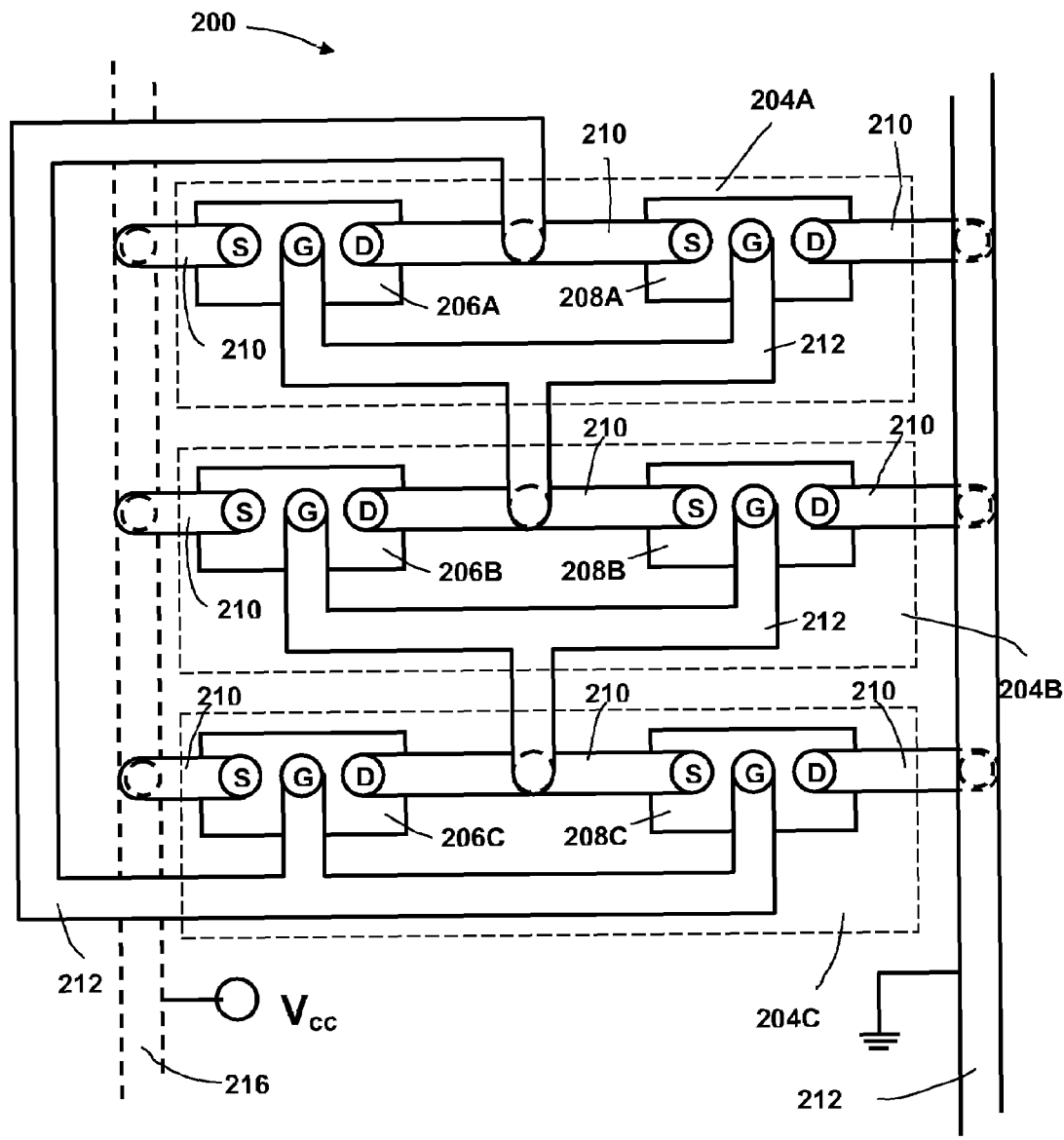
FIG. 2A is a top plan view schematic diagram of a ring-type oscillator circuit according to an embodiment of the present invention.
Figure 2B:
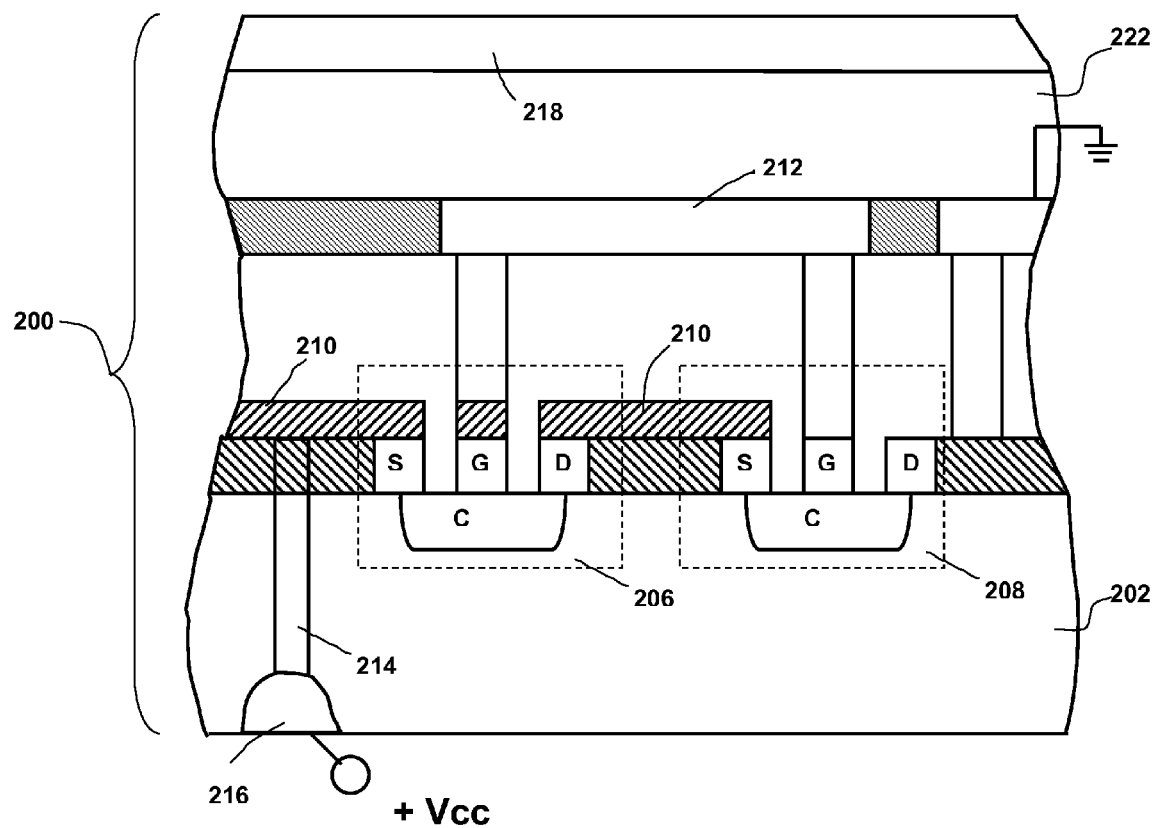
FIG. 2B is a side cross-sectional schematic view of a ring-type oscillator circuit according to an embodiment of the present invention.

FIGS. 2A-2B depict a ring type oscillator circuit 200 according to an embedment of the invention. The oscillator circuit 200 may be one of several such circuits built into a semiconductor wafer. Such circuits may be part of individual chips or may be built into the scribe lines between the chips on the wafer. The oscillator circuit 200 is built up in a series of layers from a semiconductor substrate 202. Three inverter units 204A, 204B, 204C respectively made of transistors 206A, 208A, 206B, 208B, 206C, 208C are connected in a ring type configuration, e.g., as described above with respect to FIGS. 1A-1B. Each transistor has a source (S), drain (D) and gate (G), which are connected using local conductor 210 such as polysilicon. Metal lines 212 formed from a metal layer provide connections between the inverter units 204A, 204B and 204C and provide a loop connection from inverter 204C back to inverter 204A to complete the ring. The metal lines 212 may also provide a connection to ground. Note that the metal lines 212 cannot also form a connection to a power source without shorting to the loop. Consequently, the power terminal of the test device must be isolated from the metal interconnect film in some way in order to complete the device.

Isolating one terminal of a particular test device from the interconnect film may be readily accomplished by not providing a conductive contact or via for that terminal of that device to the upper level conductive film. By way of example, as may be seen in FIG. 2B, a separate isolated conductive path 214 may be provided to the otherwise disconnected test device power terminals by connecting them all to a non-precision contact 216 on the backside of the wafer. The non-precision contact 216 is sufficiently large that an electrical probe can easily make contact with it without having to resort to high-precision positioning equipment. The isolated conductive path 214 may be accomplished in a variety of ways. For example, the conductive path 214 may be obtained by connecting the device terminal to an exposed substrate region if such exists. Alternatively, the conductive path 214 may be obtained by ion implanting a conductive channel through to the wafer substrate 202 connected to the appropriate terminal of the test device. In addition, the conductive path 214 may be obtained by etching an electrically isolated backside via through to the appropriate device terminals, filling the via with a conductor and depositing a conductive film on the wafer backside. Furthermore, the conductive path 214 may be obtained by photo-generating a conductive path in an implanted region. For example, the ion implantation may render the implanted region (or a portion thereof) photoconductive, whereby it becomes electrically conducting upon exposure to radiation of sufficient intensity and appropriate wavelength. By way of example, such photo-generation may be implemented, e.g., by illuminating silicon with photons having an energy greater than the bandgap of silicon.

In the case where it is only possible to create a backside conductive path which includes a series capacitance element, due for example to a junction, intermittent device operation may be achieved by applying a pulsed voltage power supply such that the PSRO are operational as the capacitor charges, during which time measurements can be made. It is preferred that the backside connection to these test circuits be isolated from other device components such that they operate normally. It is also necessary to avoid short-circuiting of the wafer backside connection to the conductive film on the wafer front side via the wafer edge. Various strategies of insulation or material removal are available to solve this problem. For example, certain deposition processes, such as chemical vapor deposition (CVD) are characterized by an exclusion zone at the edge of the wafer, e.g., due to a ring chuck or guard ring that extends over the wafer edge. Thus, the backside connection may be formed in this exclusion zone, thereby avoiding short circuiting from blanket deposition of metal (e.g., copper) during CVD.

Thus all of the test devices on the wafer may be externally powered and activated by applying a current source between the front and back surface of the wafer, through two simple connections.

It is noted that in some embodiments, the connections between the gates (G) of the different transistors through the metal lines 212 may be broken during fabrication of subsequent layers. These connections may then be implemented through higher level conductor layers 218 above the level of the metal lines 212 separated by interlevel dielectric 222. In this way, the oscillator 200 may be used to probe the characteristics of different metal layers as they are fabricated.

Measurement of the multiple PSRO test structures, which are thus simultaneously activated may be by analyzing RF emissions from the structures, using an antenna, amplifier and spectrum analyzer, or by measuring similar variations on the current drawn by the test structures. PSRO frequency is indicative of test structure design and device speed, and oscillation bandwidth is further indicative of loss mechanisms in the PSRO structure, and in other test interconnect elements which are introduced into the PSRO loop for purposes of separately measuring interconnect performance. Device DC characteristics, such as device leakage current and threshold voltage may be assessed at the same time.

Total emissions or current variation for the wafer can thus be measured and analyzed in aggregate in order to simultaneously assess the range of performance of all activated devices across the wafer.

Test structures can include not just active oscillator devices but also additional device structures. For example, combinations of conductor (s) and/or interconnect feature(s) can be inserted serially into the ring oscillator. The additional delay time of these circuit structures and the incremental resistance will affect the ring oscillator output and give indications of the test structure performance at device speeds. Dimensions of the circuit features can be designed to optimize sensitivity to specific process variations. For example, a narrow line feature will show more sensitivity to width variation than a wide line. Strings of via features may be used to detect level interconnect variation. Alternatively, other kinds of circuit features, such as serpentines, via chains and interdigitated comb structures or other substantially periodic structures that can act as diffraction gratings may be used.

Another embodiment of the present invention utilizes combination of line width and e-test structure information for in-chip yield and performance monitoring. Measurement of line width within device structures is a highly desirable means of controlling fabrication and predicting yield and performance variation across a die. However, CD SEM and AFM are limited in measurement performance, plus expensive and slow. Scatterometry CD on the other hand has difficulty measuring complex 3-D structures such as are found within a die, although it is very capable of measuring larger regular scribe line structures. A more effective way of controlling a process and predicting yield will be to combine scribe line CD measurements using scatterometry with scribe line and cross-chip at-speed performance monitoring using PSRO and test structures as described above. If the scribe line PSRO is placed close to the scribe line scatterometry CD target, maximum correlation of in-chip performance variation to CD variation will be achieved. Process control may be achieved by using the reference CD measurement and associated cross chip performance data.

Figure 3A:
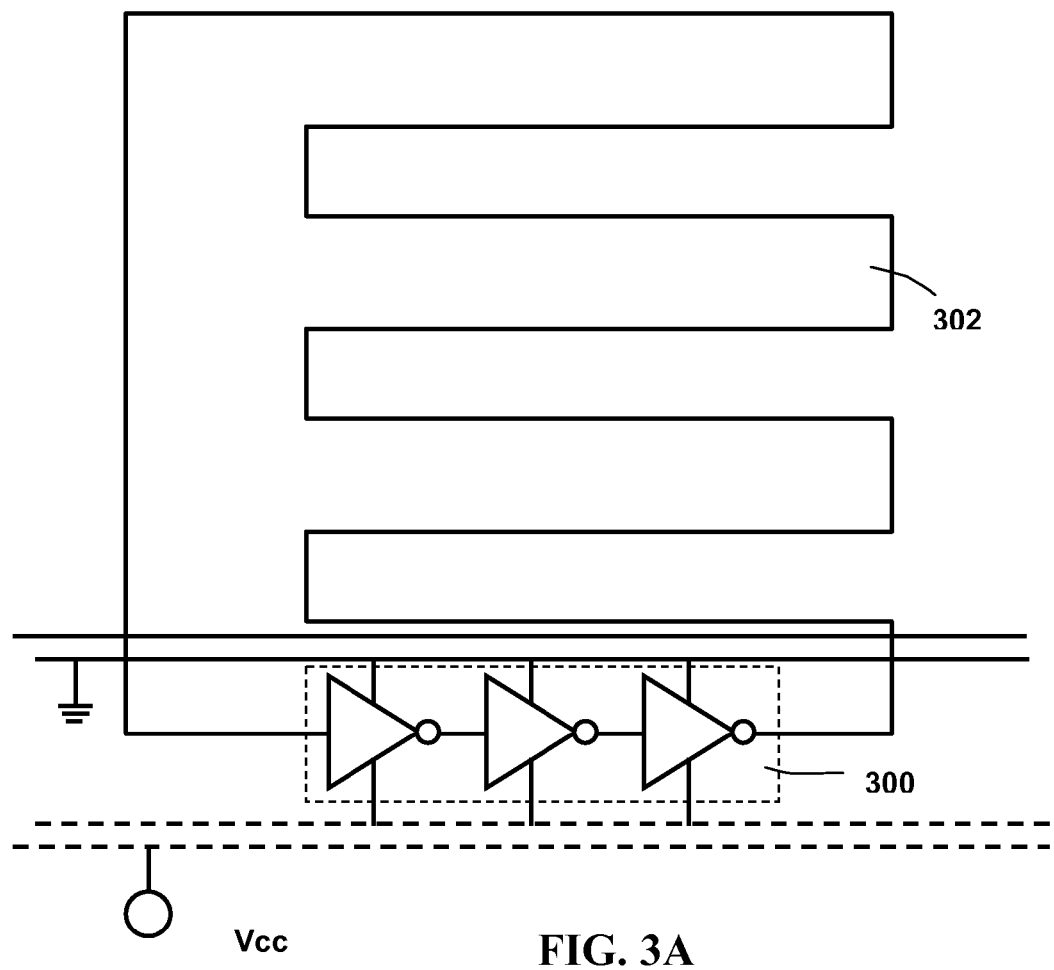
FIG. 3A is a top plan schematic view of a meander-type test structure coupled to a ring-type oscillator circuit according to an embodiment of the present invention.
Figure 3B:
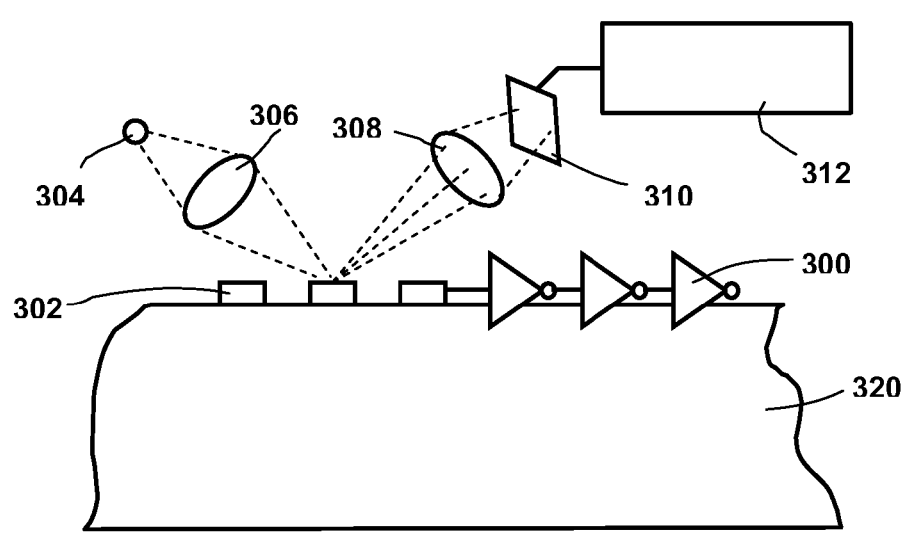
FIG. 3B is a side cross-section schematic diagram illustrating use of a test structure of the type shown in FIG. 3A as a grating target for scatterometry according to an embodiment of the present invention.

As an example of such an embodiment, FIG. 3A shows a top plan view schematic of a meander-type test structure 302 coupled to a ring-type oscillator circuit 300. The meander test structure 302 may be formed from a metal layer (e.g., metal 1) that is to be characterized. The frequency and bandwidth of a signal from the oscillator 300 and test structure 302 gives an indication of the performance of the transistors that make up the oscillator and the metal used in the interconnects. The bandwidth of the signal from the oscillator 300 depends partly on characteristics of the test structure, such as its length width, thickness and conductivity, which may be measured by scatterometry. As shown in FIG. 3B, the test structure 302 may be used as a grating target for scatterometry. Light from a source 304 is focused by optics 306 onto the test structure 302 located on a substrate 320. Light scattered from the test structure 302 is focused by collecting optics 308 onto a detector 310 controlled by electronics 312. The scatterometry results may be correlated to the at-speed performance of the test structure as measured by analysis of the oscillator signal.

The active ring oscillator 200 and others like it may be connected via conductors to additional device structural features, perhaps on subsequent device layers, whose performance is to be measured. In an alternative embodiment, a test structure such as a PSRO, may be formed entirely at a low level of the device and may sense subsequently deposited structures electromagnetically. For example, a PSRO of the type described above with respect to FIGS. 2A-2B may contain an inductive element, which forms the antenna structure, radiating energy to adjacent structures. Coupling of energy by adjacent dielectric and conductive structures affects the operating characteristics of the ring oscillator due to loading effects. As a result, the electromagnetic properties of remote device structures can be assessed using an embedded probe device.

Figure 4:
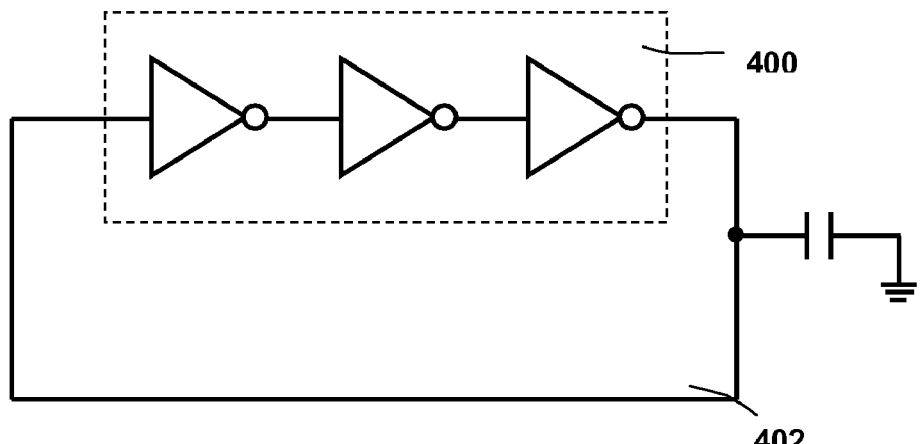
FIG. 4 is a top plan view schematic of a test structure capacitively coupled to a ring-type oscillator circuit according to an embodiment of the present invention.

For example, FIG. 4 is a top plan view schematic of a test structure 402 capacitively coupled to a ring-type oscillator circuit 400. By way of example, the oscillator circuit 400 may be formed in a lower level layer (e.g., metal 1) and capacitively coupled to a test structure formed in a higher level layer (e.g., metal 2 or higher).

Figure 5:
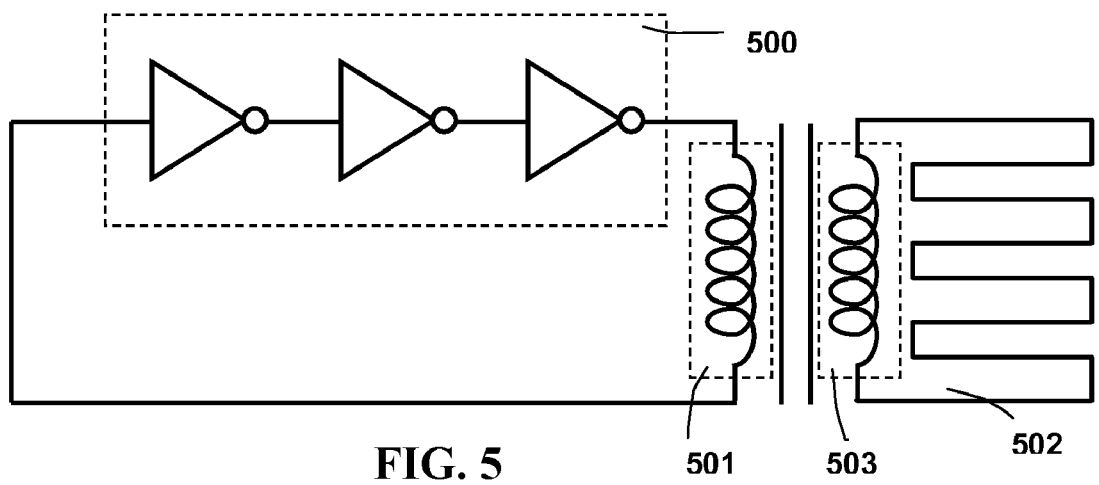
FIG. 5 is a top plan view schematic of a test structure inductively coupled to a ring-type oscillator circuit according to an embodiment of the present invention.

Alternatively, as shown in FIG. 5, a test structure 502 may be inductively coupled to a ring-type oscillator circuit 500. By way of example, the oscillator circuit 500 may be formed in a lower level layer (e.g., metal 1), e.g., as described with respect to FIGS. 2A-2B above. The oscillator 500 is connected to a transmitter antenna 501 that inductively couples a signal from the oscillator 500 to a receiver antenna 503. The receiver antenna 503 is coupled to a test structure formed in a higher level layer (e.g., metal 2 or higher). By way of example, the antennae 501, 503 may be characterized by a 2-D antenna shape, such as a dipole, spiral or other shape commonly used, e.g., in radiofrequency identification (RF-ID) tags.

Figure 6:
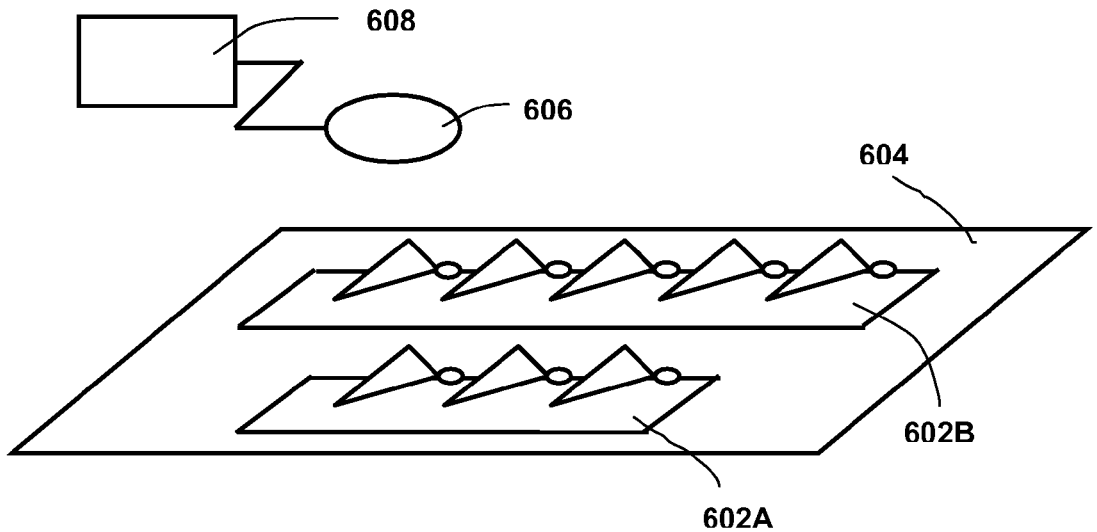
FIG. 6 is a schematic diagram illustrating characterization of test structures at a stage of fabrication of a substrate using ring oscillators according to an embodiment of the present invention.

Another embodiment of the present invention is to enable simultaneous measurement of multiple test structures embedded for example at different locations within the device active area as a means of simultaneously measuring cross chip performance variation. Oscillators at different locations within the chip may be coded with different frequencies so that the performance of each oscillator (and each corresponding region of the chip) may be determined by analyzing a single spectrum that includes the signals from all the oscillators. FIG. 6 schematically illustrates one possible scheme for implementing such cross-chip performance variation. Different ring oscillators 602A, 602B are placed at different locations on a chip 604. The oscillators may be fabricated, e.g., as described above with respect to FIGS. 2A-2B. Although two ring oscillators are shown for the sake of clarity, it is noted that any number of oscillators may be used.

An antenna 606 collects signals emitted by the oscillators 602A, 602B. Signals collected by the antenna 606 are coupled a detector 608, e.g., an amplifier and spectrum analyzer. The operating frequencies of the ring oscillators are governed by the individual device switching speeds and the number of inverter devices serially connected in the ring. In this example ring oscillators 602A and 602B have different numbers of inverters. The number of inverters may be coded to a particular location on the chip 604. In this way the oscillation frequency from each spatial location on the chip 604 will be unique. Alternatively, the oscillators 602A, 602B (and associated test structures, if any) may be coded by coupling a delay line, capacitor or inductor to a ring oscillator and/or its corresponding test structure in order to give each oscillator a unique signal frequency.

The oscillators 602A, 602B may all be powered simultaneously, and their operating frequency measured simultaneously, for example via RF emission to an antenna and amplifier coupled to an RF spectrum analyzer and frequency meter. Obviously a similar technique could be used to measure at-speed device performance at multiple sites across a wafer simultaneously, and might also be used to interrogate a collection of wafers simultaneously, for example in a wafer cassette or FOUP.

Figure 7:
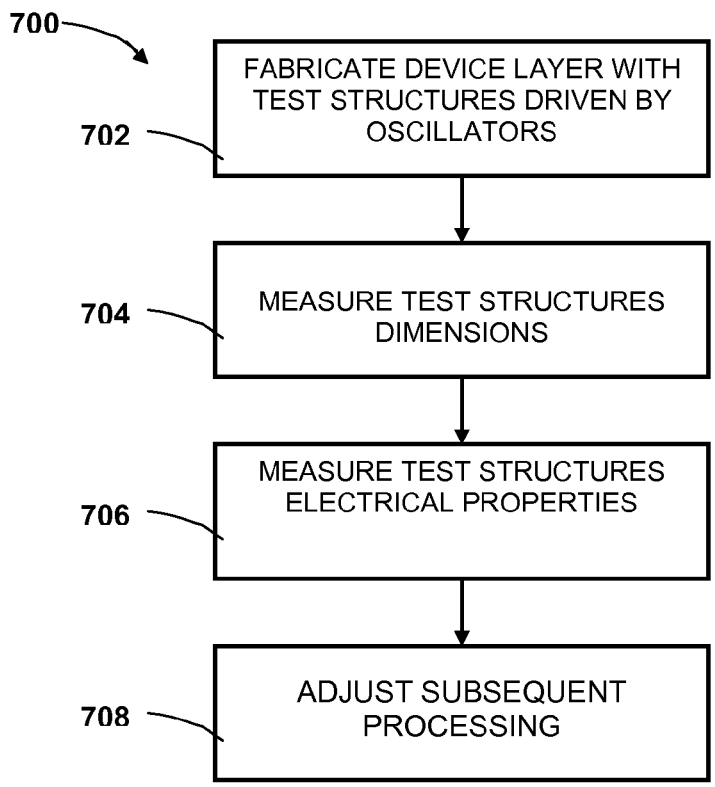
FIG. 7 is a flow diagram illustrating adaptive process control according to an embodiment of the present invention.

In another embodiment of the present invention adaptive process control may be implemented using test structures. Embedded test structures as describe previously may be activated during device processing. Information derived in real time from the test structure may be utilized to control the processing for more precise and timely control. FIG. 7 is a flow diagram illustrating an example of a method 700 for such adaptive process control. In the method 700 a device layer is fabricated with test structures as indicated at 702. The device layer includes test structures of the type described above powered by ring oscillators, e.g., as described with respect to FIGS. 2A-2B. As indicated at 704, the dimensions of the test structures are measured with conventional metrology, e.g., scatterometry, AFM, CD-SEM etc. The test structure electrical properties are then measured at-speed as indicated at 706. This may be accomplished by analyzing RF signals from the test structures powered by ring oscillators as described above. The at-speed electrical properties of a given test structure in a given layer may affect the subsequent processing of later layers as shown at 708. For example, if the electrical properties indicate that the transistors in a given layer or region of the wafer are sufficiently fast, then "fast" metal (e.g., copper) may be used to connect the transistors to other structures. If the transistors are not fast enough to justify the use of "fast" metal, slower metal (e.g., aluminum) may be used for subsequent electrical connections to these transistors.

Embodiments of the present invention provide a simple and relatively inexpensive way to power up test oscillator circuits in parallel during semiconductor fabrication. Parallel operation of the oscillators can be used to quickly characterize devices and interconnects at intermediate stages of fabrication. Results of such characterization can be used to adjust wafer processing and locate high quality devices, low quality devices and rejects. Such techniques may improve yield of devices from a batch of wafers.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. An electrical test method, comprising:
    forming one or more ring oscillators in one or more layers prior to formation of a metal 1 layer of a semiconductor wafer, the one or more layers comprising the formulation of transistors and local interconnects;
    forming one or more test structures in one or more interconnect layers at or after the metal 1 layer of the semiconductor wafer, each ring oscillator being connected to one or more test structures;
    coupling each test structure to one or more corresponding ring oscillators;
    applying voltage to one or more non-precision contacts to cause the ring oscillators to oscillate;
    obtaining one or more measured signals from one or more of the test structures; and
    determining an at-speed performance of one or more test structures from the one or more measured signals.

2. The method of claim 1, wherein obtaining one or more measured signals includes obtaining measured signals from a plurality of test structures located at two or more different locations on the semiconductor wafer.

3. The method of claim 1 wherein obtaining one or more measured signals includes measuring signals from all the test structures simultaneously.

4. The method of claim 3 wherein measuring signals from all the test structures simultaneously measuring a spectrum containing signals from all of the test structures.

5. The method of claim 4, further comprising coding the one or more ring oscillators and/or test structures such that each test structure emits a different characteristic signal, whereby signals from each test structure may be distinguished from the spectrum.

6. The method of claim 5 wherein coding the one or more ring oscillators and/or test structures includes forming two or more ring oscillators with different numbers of inverter elements.

7. The method of claim 5 wherein coding the one or more ring oscillators and/or test structures includes coupling a delay line, capacitor or inductor to the ring oscillator and/or test structure.

8. The method of claim 1, further comprising measuring one or more dimensions of a test structure and correlating the one or more dimensions to the at-speed performance of the test structure determined from the one or more measured signals.

9. The method of claim 8 wherein the test structure is in the form of a meander line, interdigitated comb or other substantially periodic structure that acts as a diffraction grating.

10. The method of claim 9 wherein measuring the one or more dimensions includes the use of scatterometry.

11. The method of claim 1 wherein applying voltage to one or more non-precision contacts to cause the ring oscillators to oscillate includes applying a pulsed voltage to a non-precision contact at a backside of the semiconductor wafer and capacitively coupling the pulsed voltage to one or more ring oscillators.

12. The method of claim 1 wherein applying voltage to one or more non-precision contacts to cause the ring oscillators to oscillate includes making an electrical connection by way of a conductive path to a non-precision contact at a backside of the semiconductor wafer to one of a ground or a source voltage.

13. The method of claim 12 wherein applying voltage to one or more non-precision contacts to cause the ring oscillators to oscillate includes making an electrical connection by way of the metal layer to the other of the ground and source voltage.

14. The method of claim 12 wherein making an electrical connection by way of a conductive path to a non-precision contact at a backside of the semiconductor wafer includes forming an electrically isolated via between a portion of one or more ring oscillators and the backside of the wafer, filling or coating the via with an electrically conductive material, and forming the non-precision contact at the backside of the wafer in electrical contact with the electrically conductive material in the via.

15. The method of claim 12 wherein making an electrical connection by way of a conductive path to a non-precision contact at a backside of the semiconductor wafer includes implanting ions into the semiconductor wafer in the form of an ion implanted channel between the portion of the ring oscillator and the non-precision contact at the backside of the semiconductor wafer.

16. The method of claim 15 wherein making an electrical connection by way of a conductive path to a non-precision contact at a backside of the semiconductor wafer includes photo-generating a conductive path in the ion implanted channel.

17. The method of claim 1, further comprising breaking electrical contact between a test structure and its corresponding ring oscillator; forming another test structure in a subsequent layer of metal above the layer 1 of metal; making electrical contact between the corresponding ring oscillator and the other test structure.

18. The method of claim 1 wherein coupling each test structure to a corresponding ring oscillator includes capacitively or inductively coupling the oscillator to the test structure.

19. The method of claim 1 wherein forming the one or more ring oscillators and test structures includes forming the ring oscillators and/or test structures in a scribe line between two or more device chips in the wafer.

20. The method of claim 1 wherein obtaining one or more measured signals from one or more of the test structures includes using one or more localized antennae to pick up signals from individual test structures.

21. The method of claim 1, further comprising:
adjusting a subsequent process step in fabricating devices on the semiconductor wafer or in fabricating devices on a subsequent wafer based on the at-speed performance of the test structures.

* * * * *

UNITED STATES PATENT AND TRADEMARK OFFICE
CERTIFICATE OF CORRECTION

| | | |
|---|---|---|
| PATENT NO. | : 7,659,126 B1 | Page 1 of 1 |
| APPLICATION NO. | : 11/625546 | |
| DATED | : February 9, 2010 | |
| INVENTOR(S) | : Smith et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 436 days.

Signed and Sealed this

Thirtieth Day of November, 2010

David J. Kappos
*Director of the United States Patent and Trademark Office*